United States Patent
Adriaens et al.

(10) Patent No.: US 11,619,886 B2
(45) Date of Patent: Apr. 4, 2023

(54) POSITION MEASUREMENT SYSTEM, INTERFEROMETER SYSTEM AND LITHOGRAPHIC APPARATUS

(71) Applicant: ASML NETHERLANDS B.V., Veldhoven (NL)

(72) Inventors: Johannes Mathias Theodorus Antonius Adriaens, Eindhoven (NL); Carolus Johannes Catharina Schoormans, Hooge Mierde (NL); Thomas Voβ, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 242 days.

(21) Appl. No.: 16/975,745

(22) PCT Filed: Mar. 1, 2019

(86) PCT No.: PCT/EP2019/055131
§ 371 (c)(1),
(2) Date: Aug. 26, 2020

(87) PCT Pub. No.: WO2019/185298
PCT Pub. Date: Oct. 3, 2019

(65) Prior Publication Data
US 2020/0409274 A1    Dec. 31, 2020

(30) Foreign Application Priority Data
Mar. 29, 2018    (EP) .................................... 18165081

(51) Int. Cl.
*G03F 7/20*    (2006.01)
*G01B 9/02015*    (2022.01)

(52) U.S. Cl.
CPC ..... *G03F 7/70775* (2013.01); *G01B 9/02015* (2013.01); *G03F 7/70716* (2013.01)

(58) Field of Classification Search
CPC .............. G01B 11/002; G01B 9/02015; G03F 7/70716; G03F 7/70775
See application file for complete search history.

(56) References Cited

U.S. PATENT DOCUMENTS 6,020,964 A    2/2000 Loopstra et al.
6,331,885 B1 *  12/2001 Nishi .................. G03F 7/70708
                                                356/399

(Continued)

FOREIGN PATENT DOCUMENTS

EP        0687957      12/1995
WO        03087710     10/2003
WO      2017021299      2/2017

OTHER PUBLICATIONS

International Search Report and Written Opinion issued in corresponding PCT Patent Application No. PCT/EP2019/055131, dated Apr. 26, 2019.

*Primary Examiner* — Deoram Persaud
(74) *Attorney, Agent, or Firm* — Pillsbury Winthrop Shaw Pittman LLP

(57) ABSTRACT

A position measurement system including a first interferometer and a second interferometer arranged to determine a distance of the object in a first direction when the object is in a first measurement area by emitting beams onto a target surface of the object. The position measurement system further has a third interferometer and a fourth interferometer arranged to determine a distance of the object in the first direction when the object is in a second measurement area by emitting beams onto the target surface of the object. An arrangement of relative positions in a second direction of beams spots impinging on the target surface from the beams emitted by the first and second interferometers is different from an arrangement of relative positions in the second direction of beams spots impinging on the target surface from the beams emitted by the third and fourth interferometers.

20 Claims, 9 Drawing Sheets

(56) References Cited

U.S. PATENT DOCUMENTS

| | | | |
|---|---|---|---|
| 6,486,955 B1 | 11/2002 | Nishi | |
| 6,495,847 B1 | 12/2002 | Asano et al. | |
| 6,952,253 B2 | 10/2005 | Lof et al. | |
| 7,019,843 B2 | 3/2006 | Hill | |
| 7,274,462 B2 | 9/2007 | Hill | |
| 7,321,432 B2 | 1/2008 | Hill | |
| 7,495,771 B2 | 2/2009 | Akimoto | |
| 2003/0063289 A1 | 4/2003 | Inoue | |
| 2003/0210404 A1* | 11/2003 | Hill | G01B 9/02027 356/500 |
| 2004/0085546 A1 | 5/2004 | Hill | |
| 2005/0157309 A1 | 7/2005 | Hill | |
| 2007/0058173 A1 | 3/2007 | Holzapfel | |
| 2007/0268584 A1* | 11/2007 | Franz | G01B 11/2441 359/578 |
| 2008/0013099 A1 | 1/2008 | Akimoto | |
| 2009/0086180 A1* | 4/2009 | Ottens | G03F 9/7003 355/75 |
| 2013/0050675 A1 | 2/2013 | Jansen et al. | |
| 2020/0379360 A1* | 12/2020 | Nienhuys | G03F 7/70783 |
| 2021/0379693 A1* | 12/2021 | Egami | B23K 26/03 |
| 2022/0137517 A1* | 5/2022 | Jansen | G03F 7/7085 355/72 |

* cited by examiner

POSITION MEASUREMENT SYSTEM, INTERFEROMETER SYSTEM AND LITHOGRAPHIC APPARATUS

CROSS REFERENCE TO RELATED APPLICATIONS

This application is the U.S. national phase entry of PCT patent application no. PCT/EP2019/055131, filed on Mar. 1, 2019, which claims the benefit of priority of European patent application no. 18165081.3, which was filed on Mar. 29, 2018, and which is incorporated herein in its entirety by reference.

FIELD

The present invention relates to the technical field of position measurement systems comprising interferometers.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

To correctly project the pattern on the substrate, the lithographic apparatus is provided with a position measurement system for determining a position of the substrate. The position measurement system measures a position of a substrate table which holds the substrate. Typical position measurement systems e.g. include encoder based measurement systems or interferometer based measurement systems. In the latter case, the position measurement system comprises one or more interferometers arranged to emit one or more beams on a target surface of the object that is to be positioned. Typically, the interferometer is stationary and the target surface is mounted to or part of the substrate table. The interferometer is arranged to irradiate the target surface with the beams. The radiation that the target surface reflects back to the interferometer is used by the interferometer to generate a signal representative of a position of the target surface. Since the reflective surface is mounted to or part of the substrate table, the signal is representative of a position of the substrate table. When a position of the substrate relative to the target surface is known, in the measurement direction, the signal representative of the position of the target surface can be used to determine a position of the substrate in the measurement direction. However, due to deformation, or un-flatness or misalignment of the target surface, the position of the substrate relative to the target surface may not be constant in a direction perpendicular to the measurement direction and the signal may not properly represent or be usable to determine the position of the substrate. As a result, when the signal is used to position the substrate, a position error occurs. The position error may cause that a substrate is not properly irradiated with the pattern.

Whilst great care is taken to ensure that the target surface is flat and properly aligned on the substrate table, it is usually necessary to measure the shape of the target surface and use the resulting mirror map to determine corrections to be applied to the signal, i.e. the measurement signal obtained from the interferometer or interferometers.

Calibration methods are known, e.g. from US2013/0050675A1, incorporated herein by reference. However these known calibration methods are time consuming, since the calibration methods require the interferometer system to perform measurements at different orientations and positions of the substrate table. The time needed for the known calibration methods may affect the throughput of the lithographic apparatus significantly. The throughput is especially affected when atmospheric conditions around the substrate table often change. For example, when the humidity around the substrate table often changes, the glue connecting the target surface to the substrate table may drift. Glue is often sensitive to changes in humidity. The humidity may change when the atmospheric condition change from atmospheric to vacuum, or may change when dry air is mixed with humid air. Due to changing atmospheric conditions, the target surface needs to be calibrated often.

WO 2017/021299, incorporated herein by reference, proposes a position measurement system using three interferometers radiating beams spaced apart from each other. The third interferometer is required during calibration because any arrangement of only two interferometers will not be able to detect at least one spatial wavelength present in the shape of the target surface. However, the third interferometer is not required during normal use of the position measurement system and thereby forms an unnecessary component during normal use, which add to the cost of the apparatus.

SUMMARY

It is an object of the invention to provide a position measurement system which can accurately and quickly be calibrated while at the same time limiting the required components.

According to a first aspect the invention provides a position measurement system for determining a position of an object, the position measurement system comprising a first interferometer and a second interferometer arranged to determine a distance of the object in a first direction when the object is in a first measurement area by emitting beams onto a target surface of the object. The position measurement system further comprises a third interferometer and a fourth interferometer arranged to determine a distance of the object in the first direction when the object is in a second measurement area by emitting beams onto the target surface of the object. An arrangement of relative positions in a second direction of beams spots impinging on the target surface from the beams emitted by the first and second interferometer is different from an arrangement of relative positions in the second direction of beams spots impinging on the target surface from the beams emitted by the third and fourth interferometer.

By arranging the beams of the first and second interferometer to impinge on the target surface in a different manner than the beams of the third and fourth interferometer, the interferometers in the second measurement area will be able to detect a spatial wavelength that cannot be detected by the interferometers in the first measurement area and vice versa. Within the meaning of the present invention, the fact that a set, e.g. a pair, of interferometers is not able to detect a particular spatial wavelength occurring present in a target surface, is also referred to as 'the interferometers being blind for said spatial wavelength'. By combining the distances of the object as determined by the first and second interferometer in the first measurement area with the distances of the object as determined by third and fourth interferometer in the second measurement area, the shape of the target surface can accurately be determined without the need to add additional interferometers.

In an embodiment a distance between a beam emitted by the first interferometer and a beam emitted by the second interferometer in the second direction is different from a distance between a beam emitted by the third interferometer and a beam emitted by the fourth interferometer in the second direction. In this embodiment, the arrangement of beams impinging on the target surface is adapted by selecting the distance between the beams emitted by third and fourth interferometer to be different from the distance between the beams emitted by first and second interferometer.

In a further embodiment the beam of the first interferometer comprises a first primary beam and a first secondary beam, the beam of the second interferometer comprises a second primary beam and a second secondary beam, the beam of the third interferometer comprises a third primary beam and a third secondary beam, and the beam of the fourth interferometer comprises a fourth primary beam and a fourth secondary beam. In this embodiment the interferometers may for example be double-pass interferometers.

In a further embodiment the first primary beam is spaced from the first secondary beam in the second direction by a first beam distance. The first secondary beam is spaced from the second primary beam in the second direction by a second beam distance. The second primary beam is spaced from the second secondary beam in the second direction by a third beam distance. The third primary beam is spaced from the third secondary beam in the second direction by a fourth beam distance. The third secondary beam is spaced from the fourth primary beam in the second direction by a fifth beam distance. The fourth primary beam is spaced from the fourth secondary beam in the second direction by a sixth beam distance. At least one of the first and fourth beam distance, or the second and fifth beam distance, or the third and sixth beam distance are different from each other. As such the arrangement of beams emitted by the first and second interferometer is different from the arrangement of beams emitted by third and fourth interferometer, as is the arrangement of relative positions in a second direction of beams spots impinging on the target surface In an embodiment the position measurement system comprises a processing unit arranged to determine the shape of the target surface based on the distances of the object as determined by the first interferometer, the second interferometer, the third interferometer and the fourth interferometer. As such the position measurement system is arranged to perform the calibration for the target surface of the object.

In a further embodiment the processing unit is configured to determine a reference position of the target surface of the object in the second direction relative to the beams of the first and second interferometer when the object is in the first measurement area and relative to the beams of the third and fourth interferometer when the object is in the second measurement area, and the processing unit is arranged to determine the shape of the target surface based on the determined reference position. The reference position facilitates combining the distances of the object determined by the first and second interferometer with the distances of the object determined by the third and fourth interferometer.

In an embodiment of the position measurement system, the processing unit is arranged to determine a first spatial wavelengths profile of the shape of the target surface based on the distances of the object determined by the first and second interferometer in the first measurement area, and to determine a second spatial wavelengths profile of the shape of the target surface based on the object distances determined by the third and fourth interferometer in the second measurement area. The processing unit is further arranged to make a weighted combination of the first spatial wavelength profile and the second spatial wavelength profile, wherein weight coefficients are based on differences between the first spatial wavelength profile and the second spatial wavelengths profile. Said differences facilitate combining the distances of the object determined by the first and second interferometer with the distances of the object determined by the third and fourth interferometer.

In an embodiment the processing unit is arranged to take into account design data when determining the shape of the target surface. This enables to determine the shape of the target surface more accurately.

The invention further relates to a lithographic apparatus comprising the position measurement system according to the invention. The lithographic apparatus further comprises a mask support for holding a patterning device having a pattern, a projection system for projecting the pattern onto a substrate, and a substrate table for holding the substrate. The substrate table comprises the object. The position measurement system is thus applied to determine the position of the substrate table and can accurately and quickly be calibrated while only requiring two interferometers per measurement area.

The invention further relates to a method for calibrating a position measurement system for positioning an object, the method comprising the steps of arranging the object in a first measurement area, moving the object in a second direction in the first measurement area and determining a plurality of distances of the object in a first direction using a first interferometer and a plurality of distances of the object in the first direction using a second interferometer. The method further comprises the steps of arranging the object in a second measurement area, moving the object in the second direction in the second measurement area and determining a plurality of distances of the object in the first direction using a third interferometer and a plurality of distances of the object in the first direction using a fourth interferometer, wherein an arrangement of beams emitted by the first and second interferometer onto a target surface of the object is different from an arrangement of beams emitted by the third and fourth interferometer onto the target surface of the object. The method further comprises the step of determining the shape of the target surface of the object based on the distances of the object as determined by the interferometers in the first and second measurement area.

A second aspect of the invention relates to an interferometer system for measuring the position of an object comprising a target surface. The interferometer system comprises a first interferometer arranged to determine a first object distance in a first direction by emitting a first beam and a second beam on the target surface of the object, and a second interferometer arranged to determine a second object distance in the first direction by emitting a third beam and a fourth beam on the target surface of the object. The first beam, the second beam, the third beam, and the fourth beam are spaced from each other in a second direction. The third beam is arranged between the first beam and the second beam in the second direction.

By this particular arrangement of the beams emitted by the interferometers, a 'blindness' of the interferometer system for certain spatial wavelengths is overcome. Accuracy in the calibration is thereby increased for those spatial wavelengths, while only requiring two interferometers.

In an embodiment the second beam is arranged between the third beam and the fourth beam in the second direction.

In an embodiment the interferometer system further comprises a processing unit arranged to determine the shape of the target surface based on the first and second object distances determined by the first and second interferometers.

In an embodiment of the interferometer system the first beam is spaced from the third beam in the second direction by a first beam distance, the third beam is spaced from the second beam in the second direction by a second beam distance, and the second beam is spaced from the fourth beam in the second direction by a third beam distance. The first beam distance, the second beam distance and the third beam distance are substantially equal, e.g. 13 mm. In this embodiment the blindness of the interferometer system for the spatial wavelengths which is twice as long as the first, second and third beam distance is overcome.

The second aspect of the invention further relates to a position measurement system for determining the position of an object, comprising the interferometer system according the second aspect of the invention.

The second aspect of the invention further relaters to a lithographic apparatus comprising the position measurement system according to the second aspect of the invention. The lithographic apparatus further comprises a mask support for holding a patterning device having a pattern, a projection system for projecting the pattern onto a substrate, and a substrate table for holding the substrate. One of the pattering device support and the substrate table comprises the object. The position measurement system is thus applied to determine the position of the substrate table or the mask support, and can accurately and quickly be calibrated while only needing two interferometers.

The first aspect of the invention and the second aspect of the invention can advantageously be combined. For example, the first and second interferometer and/or the third and fourth interferometer of the first aspect of the invention may be embodied according to the second aspect of the invention.

The lithographic apparatus according to the first aspect and/or the second aspect of the invention may in an embodiment comprise a further position measurement system, preferably according to one or more aspects of the invention. The position measurement system is arranged to determine the position of the object in first direction and to determine the shape of a first target surface of the object in a second direction perpendicular to the first direction, and the further position measurement system is arranged to determine the position of the object along the second direction. As such the lithographic apparatus can determine the position of the object in both the first and second direction.

In a further embodiment the further position measurement system comprises a processing unit arranged to determine the shape of a further target surface of the object in the first direction.

BRIEF DESCRIPTION OF THE DRAWINGS

Embodiments of the invention will now be described, by way of example only, with reference to the accompanying schematic drawings in which like reference numerals indicate like features, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
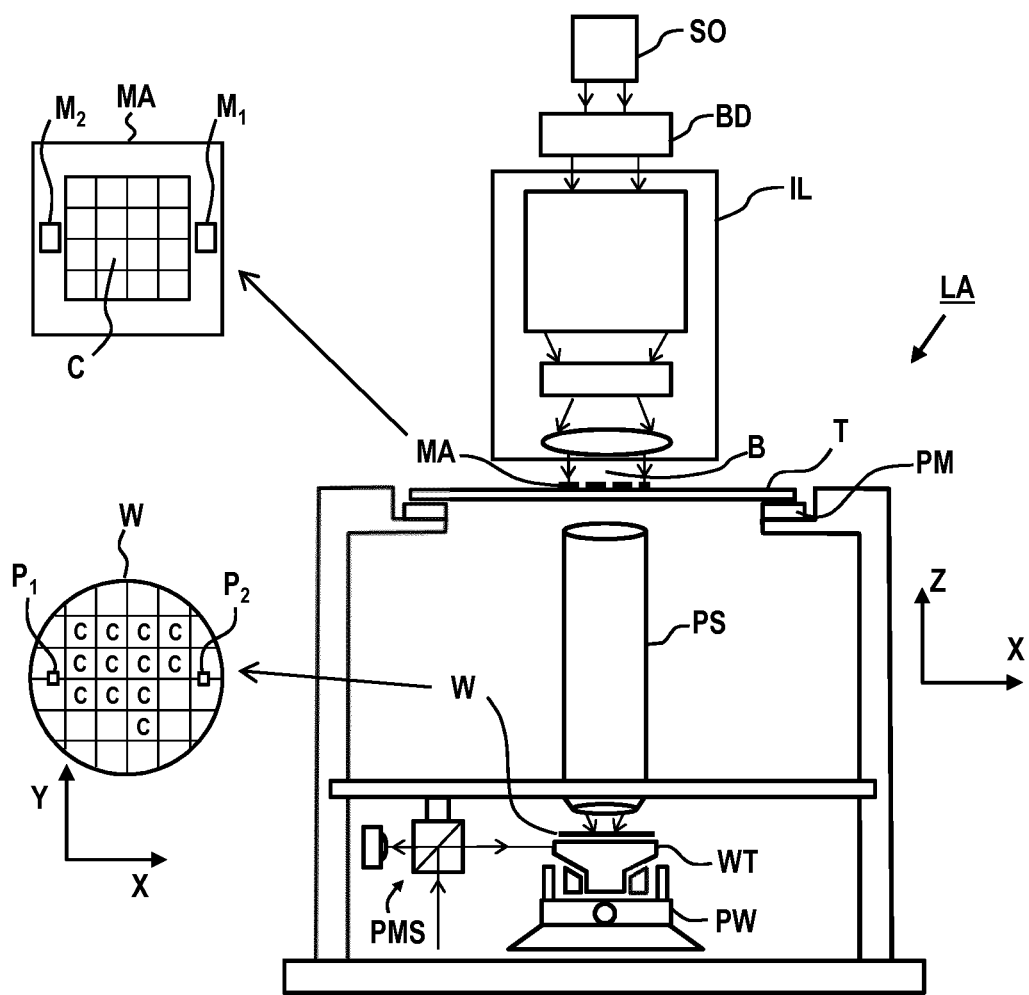
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W. In order to control a position of the substrate support WT, the lithographic apparatus LA comprises a position measurement system PMS, e.g. a position measurement system according to the present invention.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an X-axis, a Y-axis and a Z-axis. Each of the three axis is orthogonal to the other two axis. A rotation around the X-axis is referred to as an Rx-rotation. A rotation around the Y-axis is referred to as an Ry-rotation. A rotation around about the Z-axis is referred to as an Rz-rotation. The X-axis and the Y-axis define a horizontal plane, whereas the Z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the Z-axis has a component along the horizontal plane.

Figure 2:
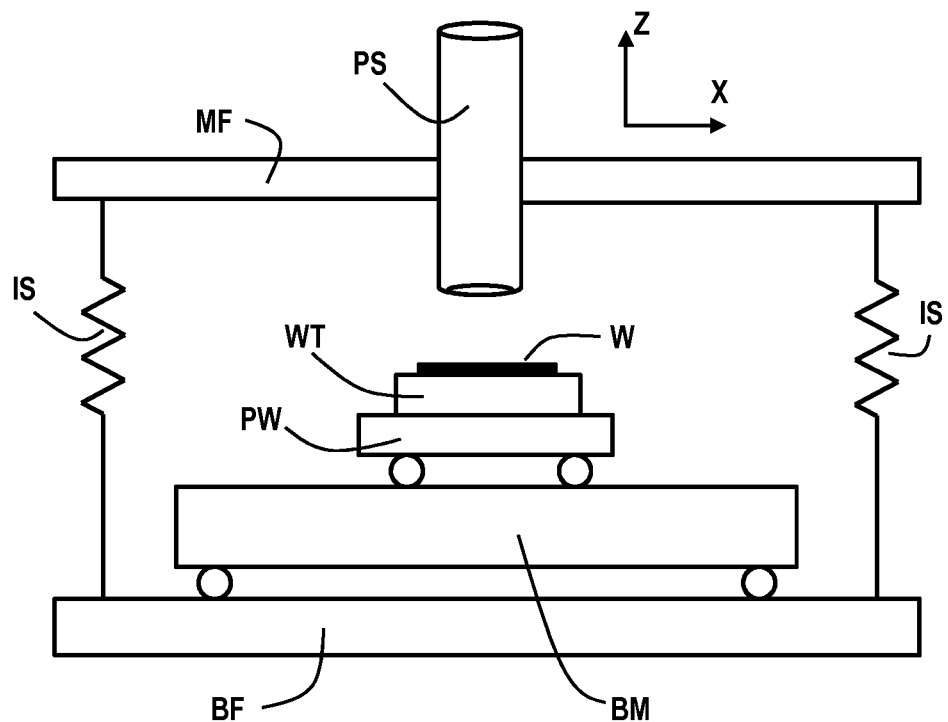
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, U.S. patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
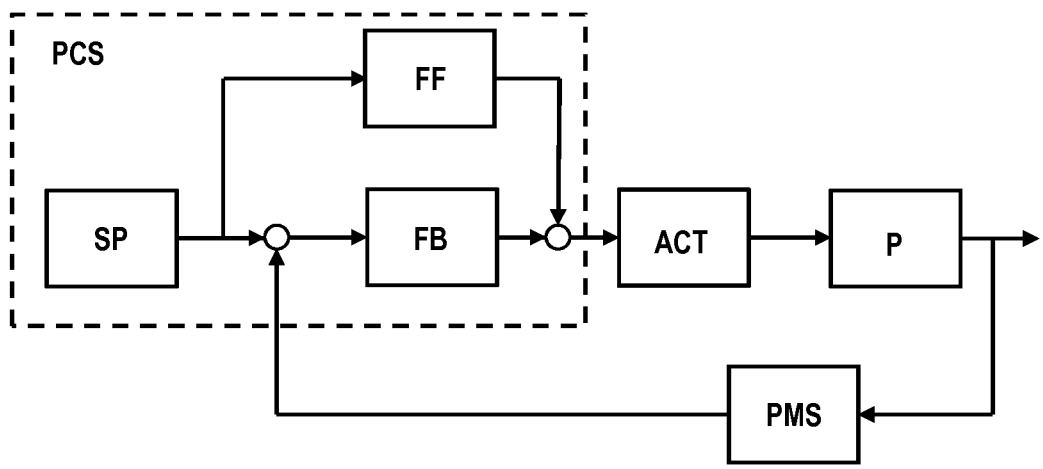
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigen frequencies.

A first aspect of the invention relates to a position measurement system for determining the position of an object, which may e.g. be position measurement system PMS, the object in that embodiment being comprised by the substrate table WT.

Figure 4A:
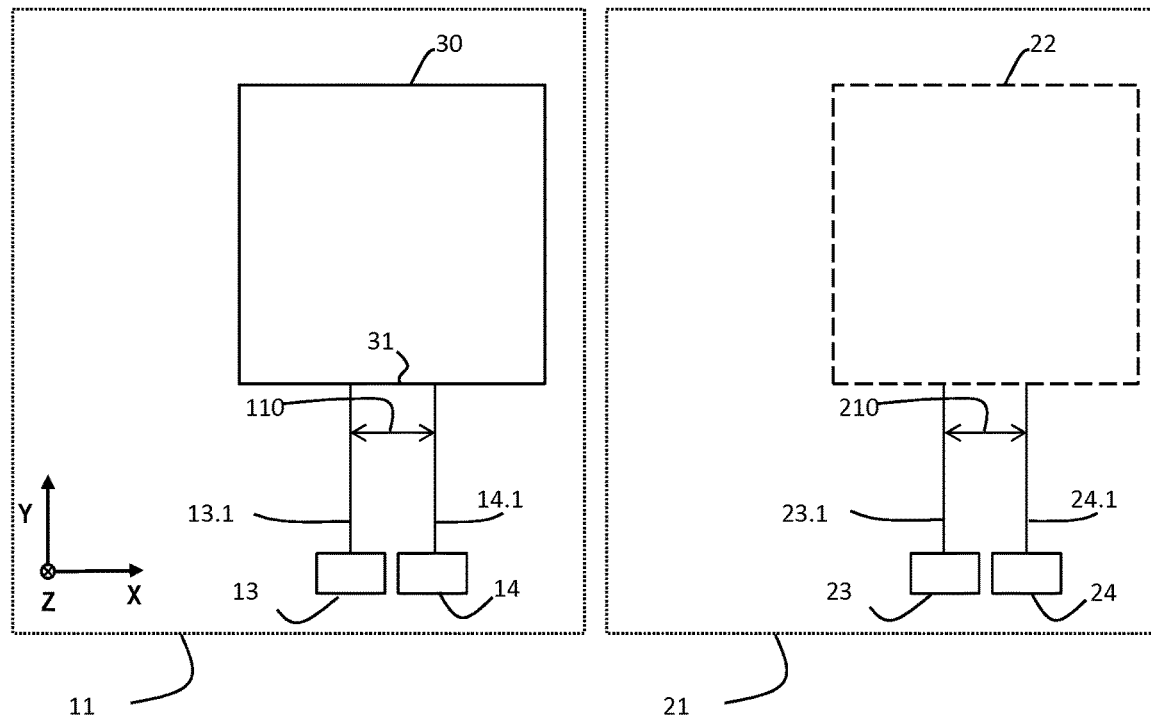
FIGS. 4a-4b schematically depict a known position measurement system

FIG. 4a shows an arrangement of a position measurement system according to the prior art in top view. A first measurement area 11 and a second measurement area 21 can be identified.

In the situation depicted in FIG. 4a, an object 30 is arranged in the first measurement area 11. The object 30 can be moved at least in the X-direction to be arranged in the second measurement area 21, e.g. in the area indicated by reference numeral 22. The position measurement system comprises a first interferometer 13 emitting a beam 13.1 and a second interferometer 14 emitting a beam 14.1, which are arranged to determine a distance of the object 30 in a first direction Y when the object 30 is in the first measurement area 11. The beams 13.1, 14.1 are spaced from each other in a second direction X, preferably being perpendicular to the first direction Y. The position measurement system comprises a third interferometer 23 emitting a beam 23.1 and a fourth interferometer 24 emitting a beam 24.1, which are arranged to determine a distance of the object 30 in the first direction Y when the object is in the second measurement area 21.

The interferometers 13, 14, 23, 24 are arranged to emit the beams 13.1, 14.1, 23.1, 24.1 on a target surface 31 of the object 30, resulting in an arrangement of beam spots impinging on the target surface 31. The target surface 31 is reflective such that it reflects the beams 13.1, 14.1, 23.1, 24.1 back to the interferometers 13, 14, 23, 24. The beams 13.1 and 14.1 are spaced from each other in the second direction X by a distance 110, and the beams 23.1 and 24.1 are spaced from each other in the second direction X by a distance 210. In the known system the distance 110 in the first measurement area 11 is substantially equal to the distance 210 in the second measurement area 21.

Based on the distances of the object 30 determined by the interferometers of the position measurement systems, a position control system, e.g. the position control system PCS, can control the position of the object 30. In case the object is an object table holding a substrate, the position control system is intended to control a position of the substrate, based on a position measurement of the target surface of the object table. In order to do so, accurate knowledge of the shape of the target surface is required. Therefore, the position measurement system is calibrated before use, said calibration including a reconstruction of the shape of the target surface 31. The shape of the target surface 31 can be reconstructed by moving the object 30 in the second direction X and measuring a plurality of distances of the object with the interferometers 13, 14, based on differences between the distance determined by interferometer 13 and the distance determined by interferometer 14. In particular, during such a calibration, the object 30 is controlled to displace along the X-direction while the Y-position of the object is kept at a predetermined value, e.g. based on either a signal from interferometer 13 or interferometer 14. However, when doing so, the shape of the target surface 31 cannot be correctly reconstructed with the position measurement system shown in FIG. 4a.

Figure 4B:
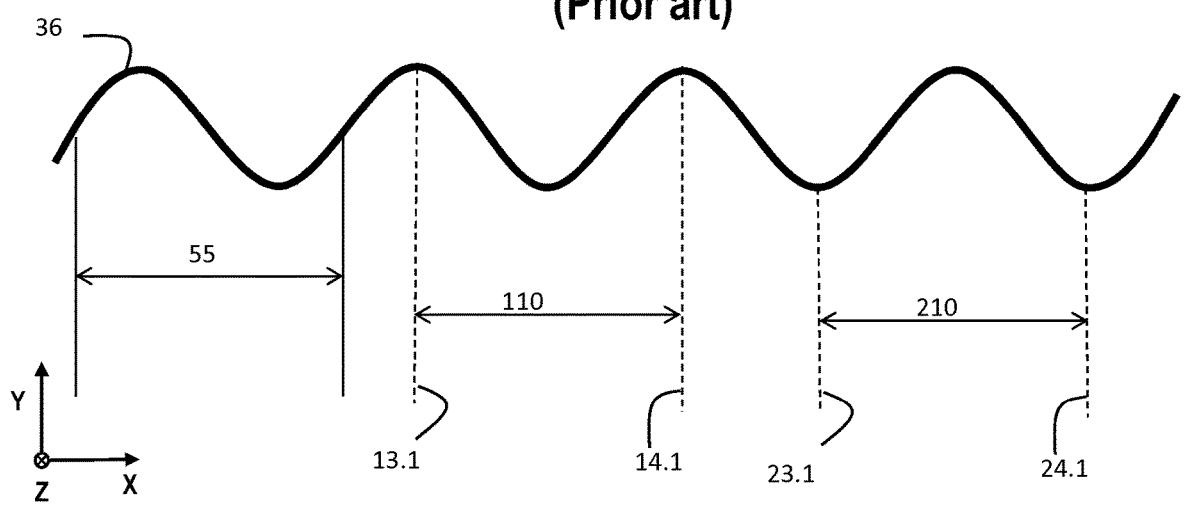

The shape of the target surface 31 may in general be irregular and may, mathematically be decomposed into different spatial wavelengths or wavelength component. As such, the shape of the target surface may be considered to comprise a combination of different spatial wavelengths. FIG. 4b shows one particular component 36 of the shape of a target surface 31, the component 36 having a spatial wavelength 55 that is equal to the distance 110 between beam 13.1 and beam 14.1. The changes in the shape of the target surface according to this spatial wavelength 55, i.e. variations of the surface Y-position along the X-direction are not detected by the difference between the distance determined by interferometer 13 and the distance determined by interferometer 14, because said distances change simultaneously. The same applies for the difference between the distance determined by interferometer 23 and the distance determined by interferometer 24 since distance 210 is also equal to spatial wavelength 55. The position measurement system according to the prior art is thus blind for this spatial wavelength 55.

No combination of two interferometers can reconstruct the spatial wavelength of the shape of the target surface for which the spatial wavelength is equal to the distance between the beams of the interferometers. As such, when a target surface of an object such as an object table is reconstructed using only one pair of interferometers, there is a risk that a particular spatial wavelength is not reconstructed. To increase the accuracy of the reconstruction of the shape of the target surface additional interferometers would thus be required during calibration. However, only two interferometers are required during normal use for determining the position of the object with the position measurement system.

Figure 5A:
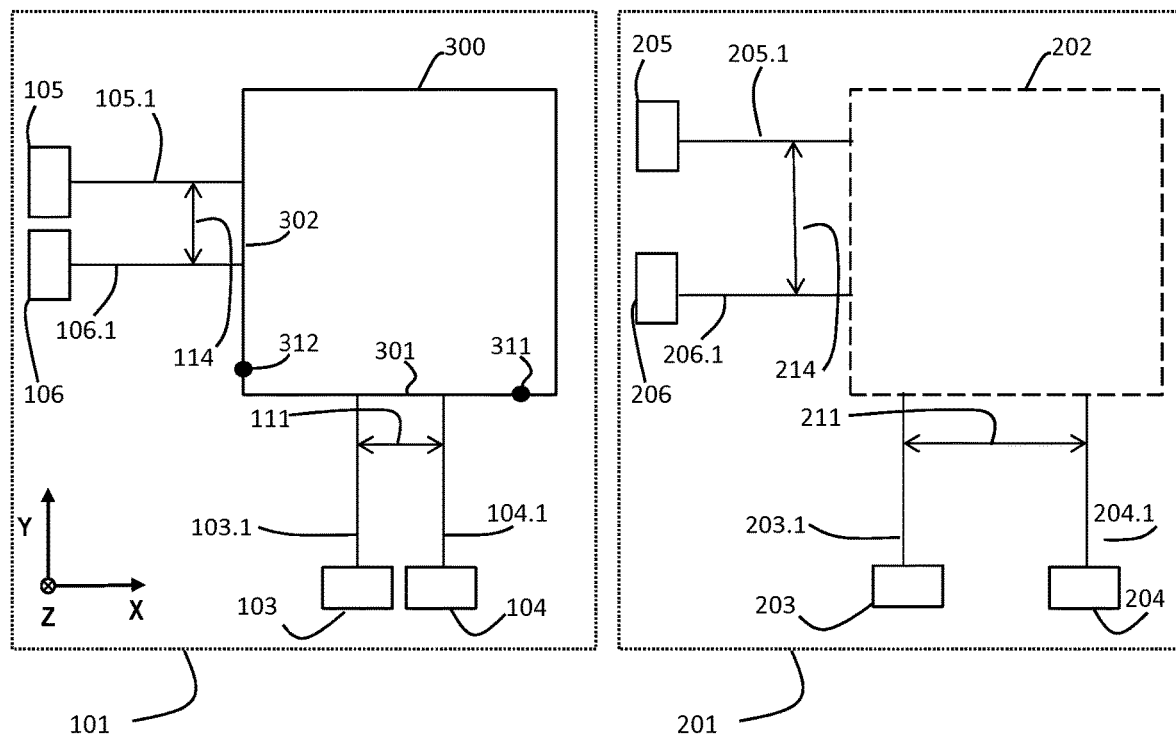
FIGS. 5a-5c schematically depict a position measurement system according to a first embodiment of a first aspect of the invention FIGS. 6a-6b schematically depict a position measurement system according to a second embodiment of a first aspect of the invention FIGS. 7a-7b schematically depict a known interferometer system FIGS. 8a-8c schematically depict an interferometer system according to a second aspect of the invention

The invention therefore proposes a position measurement system PMS as shown in FIG. 5a, which depicts a first embodiment of the first aspect of the invention. The position measurement system PMS according to the first aspect of the invention comprises a first interferometer 103 and a second interferometer 104 arranged to determine a distance of the object 300 in a first direction Y when the object 300 is in a first measurement area 101 by emitting beams 103.1, 104.1 onto a target surface 301 of the object 300. It further comprises a third interferometer 203 and a fourth interferometer 204 arranged to determine a distance of the object 300 in the first direction Y when the object is in a second measurement 201 area by emitting beams 203.1, 204.1 onto the target surface 301 of the object 300. According to the invention, a relative position, in the second direction X, of beam spots impinging on the target surface 301 from the beams 103.1, 104.1 emitted by the first and second interferometer 103, 104 is different from a relative position in the second direction X of beam spots impinging on the target surface 301 from the beams 203.1, 204.1 emitted by the third and fourth interferometer 203, 204.

The first measurement area 101 and the second measurement area 201 may, in some embodiments, be at least partially overlapping, in the shown embodiment they are non-overlapping.

This may e.g. be the case in a dual stage lithographic apparatus wherein in the first measurement area 101 steps in preparation of a subsequent exposure of the substrate W are carried out, also referred to as the measure side, and in the second measurement area 102 the substrate W is exposed to a pattern, also referred to as the exposure side. The object 300 can be moved at least in the X-direction to be arranged in the second measurement area 201, e.g. in the area indicated by reference numeral 202. Preferably the object 300 can also be moved in the Y-direction and/or the Z-direction.

The target surface 301 is reflective such that it reflects the beams 103.1, 104.1, 203.1, 204.1 back to the interferometers 103, 104, 203, 204.

In an embodiment, e.g. the embodiment shown in FIG. 5a, the distance 111 between beam 103.1 emitted by the first interferometer 103 and beam 104.1 emitted by the second interferometer 104 in the second direction X is different from the distance 211 between beam 203.1 emitted by the third interferometer 203 and beam 204.1 emitted by the fourth interferometer 204 in the second direction X. Compared to the position measurement system shown in FIG. 4a, the distance 211 between beam 203.1 and beam 204.1, emitted by the third and fourth interferometer 203, 204 arranged in the second measurement area 201, has been enlarged. It is noted however that it is also envisaged within the scope of the invention to reduce said distance 211.

Figure 5B:
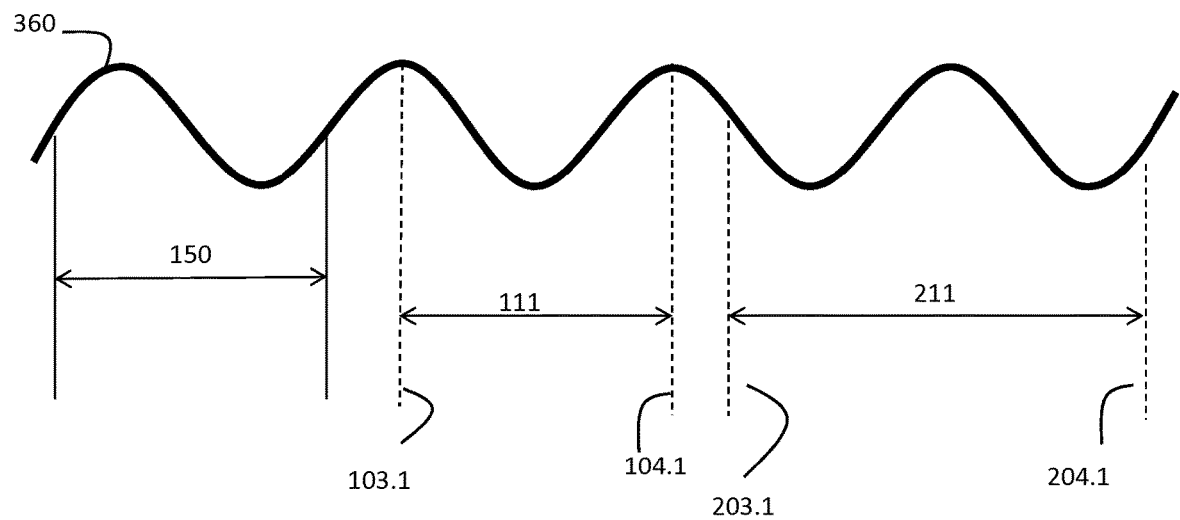

FIG. 5b shows, in a similar manner as FIG. 4b, one particular component 360 of the shape of a target surface 301, the component 360 having a spatial wavelength 150, said wavelength 150 being equal to the distance 111 between beam 103.1 and beam 104.1. The first and second interferometers 103, 104 arranged in the first measurement area 101 are thus blind for this spatial wavelength 150. However, the third and fourth interferometer 203, 204 are no longer blind for this spatial wavelength 150, because the distance 211 between the beams 203.1, 204.1 is not equal to the spatial wavelength 150.

The interferometers 203, 204 arranged in the second measurement area 101 are blind for a different spatial wavelength than the interferometers 103, 104 arranged in the first measurement area 101. As such, a more accurate determination of the shape of the target surface 301 can be achieved by combining measurements in the first and second measurement area 101, 102.

Figure 5C:
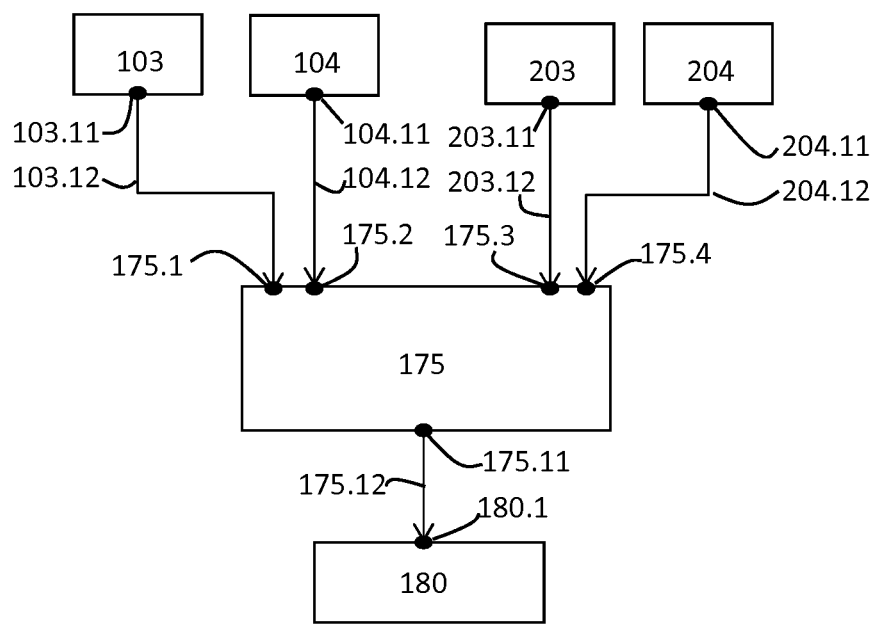

In an embodiment, e.g. the embodiment shown in FIG. 5a, the position measurement system PMS may further comprises a processing unit 175 of which an embodiment is shown in FIG. 5c. The processing unit 175 arranged to determine the shape of the target surface 301 based on the distances of the object 300 as determined by the interferometers 103, 104, 203, 204 in the first and second measurement area 101, 102.

In the shown embodiment each of the interferometers 103, 104, 203, 204 comprises a output terminal 103.11, 104.11, 203.11, 204.11 respectively, to send a signal 103.12, 104.12, 203.12, 204.12 respectively to the processing unit 175. Said signals 103.12, 104.12, 203.12, 204.12 represent the distance of the object as determined by the respective interferometer 103, 104, 203, 204. In the shown embodiment the processing unit 175 comprises four input terminals 175.1, 175.2, 175.3, 175.4 for receiving said signals 103.12, 104.12, 203.12, 204.12, although it is noted that in some embodiments this could be incorporated in a single input terminal. The processing unit 175 may determine the shape of the target surface based on the signals 103.12, 104.12, 203.12, 204.12. The processing unit 175 may e.g. be connected to a positioning system 180 for sending a signal 175.12 representing a determined position of the object via an output terminal 175.11 to an input terminal 180.1 of the positioning system 180. For determining said position of the object the determined shape of the target surface may be taken into account. The positioning system 180 is arranged to position the object.

Referring now back to FIG. 5a, in an embodiment the processing unit 175 is configured to determine a reference position 311 of the target surface 301 of the object 300 in the second direction X relative to the beams 103.1, 104.1 of the first 103 and second interferometers 104 when the object 300 is in the first measurement area 101, and relative to the beams 203.1, 204.1 of the third 203 and fourth interferometer 204 when the object 300 is in the second measurement area 201. The processing unit 175 is further arranged to determine the shape of the target surface 301 based on the determined reference positions 311.

Based on the reference position 311, the distances determined by the first and second interferometer 103, 104 in the first measurement area 101 can be matched to the distances determined by the third and fourth interferometer 203, 204 in the second measurement area 201.

The reference position 311 can e.g. be determined by recognizing a marker which is arranged on the target surface 301. Preferably the market is recognizable by the interferometers 103, 104. 203. 204. For example, the marker may be a protrusion or notch in the target surface 301.

In an embodiment, the processing unit is arranged to determine a first spatial wavelengths profile of the shape of the target surface 301 based on the distances of the object 300 determined by the first and second interferometer 103, 104 in the first measurement area 101. The processing unit 175 is further arranged to determine a second spatial wavelengths profile of the shape of the target surface 301 based on the distances of the object 300 determined by the third and fourth interferometer 203, 204 in the second measurement area 201. The processing unit 175 is then arranged to make a weighted combination of the first spatial wavelength profile and the second spatial wavelength profile, wherein weight coefficient are based on differences between the first spatial wavelength profile and the second spatial wavelength profile. It is noted that this embodiment can be applied as an alternative for the embodiment wherein the processing unit 175 is configured to determine a reference position, or in combination with said embodiment.

For example, the first spatial wavelength profile and the second spatial wavelengths profile can be determined by converting the distances determined by the first and second interferometer 103, 104 or the third and fourth interferometer 203, 204, respectively, into the frequency domain, e.g. by a Fourier transform. In the spatial wavelengths profiles, the spatial wavelength for which the respective interferometers are blind will be underrepresented. This spatial wavelength can e.g. be determined by comparing the first and second spatial wavelengths profile, wherein said underrepresented wavelength will be more present in the other spatial wavelengths profile. Said spatial wavelength can also be determined from the physical arrangement of the interferometers, as it is dependent on the distance 111, 211 between the beams. Based on said underrepresented spatial wavelengths weight coefficients can be determined for making the weighted combination of the first and second spatial wavelengths profile. For example, the weight coefficients are such that said underrepresented spatial wavelengths has a higher contribution to the combination, e.g. twice as much as the other spatial wavelengths. The weighted combination constitutes a more accurate spatial wavelengths profile of the target surface 301 of the object 300, based on which the shape of said target surface 301 can be determined with more accuracy.

Another possible implementation may include constructing a blindness filter for each measurement zone which represent the blindness of the interferometers of the respective measurement zone. By applying the blindness filter of one measurement zone to the measurements of the other measurement zone the spatial wavelengths profile of both measurement zones can be constructed to be substantially equal. As a result, they can be more easily be mapped onto each other. In particular, positions on the target surface can be linked to measurements of both profiles, without requiring knowledge of a reference position; the substantially equal profiles obtained by the filtering can be shifted relative to each other until a match is found between the first and second spatial wavelengths profile. Note that a similar result may be obtained by observing a particular spatial wavelength component that is present in both the first and second spatial wavelength profile, i.e. a particular spatial wavelength component that for which none of the interferometers are blind.

In an embodiment the processing unit 175 is arranged to take into account design data when determining the shape of the target surface 301. Such design data may e.g. include statistical expectations of spatial wavelengths, which may e.g. be caused by hardware specifications or tolerances. It may also include that spatial wavelengths under a predetermined limit do no occur in the shape of the target surface 301, or that such spatial wavelengths may be retrieved from another measurement, e.g. with another measurement system. It may also include that the shape of the target surface 301 does not include protrusions or grooves larger than a predetermined limit. It may also include independent measurements which have been performed earlier or the same or similar objects. By taking into account this information the accuracy of the determination of the shape of the target surface 301 can be increased.

The invention provides in a position measurement system PMS which enables accurate calibration without the need for additional components. A possible method to perform the calibration comprises a first step of arranging the object 300 in a first measurement area 101, followed by moving the object 300 in the second direction X in the first measurement area 101 and determining a plurality of distances of the object 300 in the first direction Y using the first interferometer 103 and a plurality of distances of the object 300 in the first direction Y using the second interferometer 104. The object 300 is then arranged in the second measurement area 201, followed by moving the object 300 in the second direction X in the second measurement area 201 and determining a plurality of distance of the object 300 in the first direction Y using the third interferometer 203 and a plurality of distances of the object 300 in the first direction Y using the fourth interferometer 204. An arrangement of beams emitted by the first interferometer 103 and second interferometer 104 onto the target surface 301 of the object 300 is different from an arrangement of beams emitted by the third interferometer 203 and the fourth interferometer 204 onto the target surface 301 of the object 300. Each of the plurality of distances determined with the interferometers constitute a measurement point along the target surface for which an equation can be formulated based on the determined distances. Then the shape of the target surface 301 is determined based on the distances of the object 300 as determined by the interferometers 103, 104, 203, 204 in the first and second measurement area 101, 201.

In an embodiment of the method, the number of measurement points of the target surface 301 in the second direction X on which the plurality of distances is measured with the third interferometers 203 and the fourth interferometer 204 is based on the spatial wavelength for which the first interferometer 103 and the second interferometer 104 are blind. For example, less measurements points may be required in the second measurement area 201 than in the first measurement area 101. Since the determination of the shape of the target surface 301 by the first and second interferometer 103, 104 is accurate for spatial wavelengths other than those for which they are blind, the third and fourth interferometer 203, 204 can be used to determine only said spatial wavelengths. More frequent measurement points are not required to determine the other spatial wavelengths.

Figure 6A:
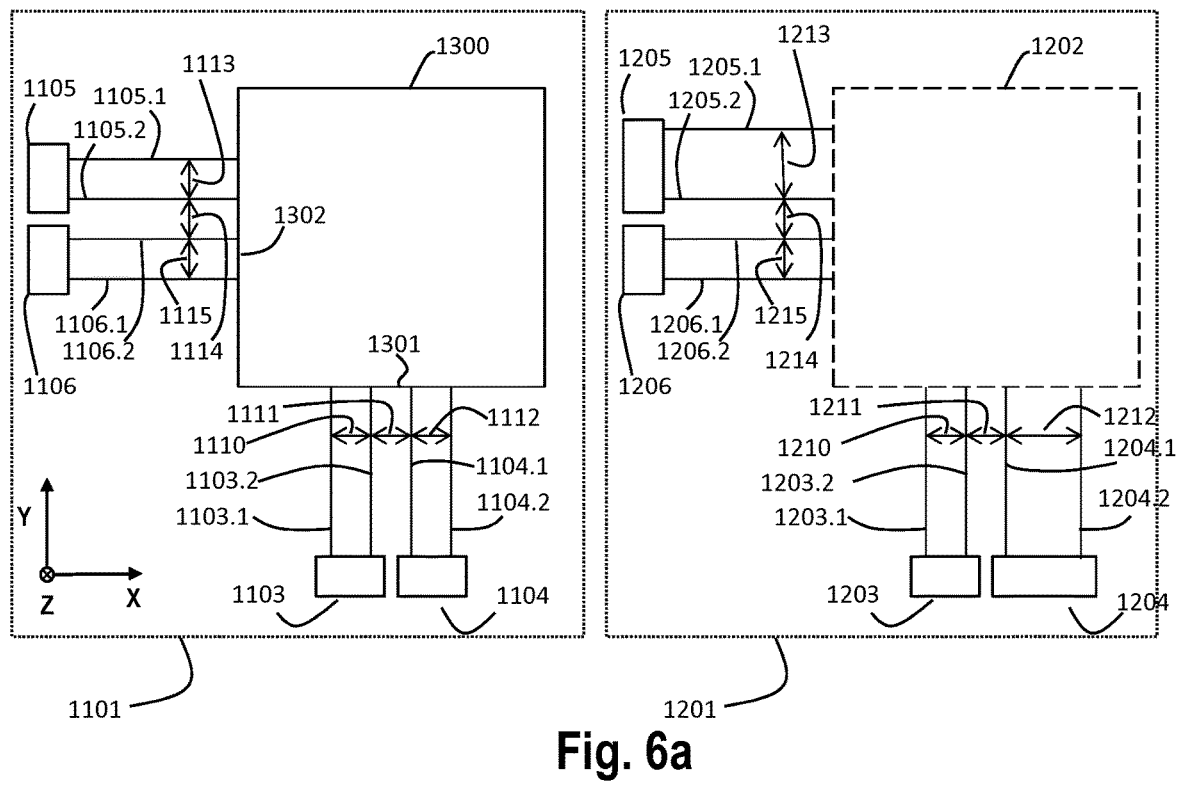

FIG. 6a shows a second embodiment of the position measurement system PMS according to the invention. Again a first interferometer 1103 and a second interferometer 1104 are arranged in a first measurement area 1101 for determining the distance of an object 1300 in a first direction Y by emitting beams onto a target surface 1301 of the object 1300, and a third interferometer 1203 and a fourth interferometer 1204 are arranged in a second measurement area 1201. In this embodiment the beam of the first interferometer 1103 comprises a first primary beam 1103.1 and a first secondary beam 1103.2, the beam of the second interferometer 1104 comprises a second primary beam 1104.1 and a second secondary beam 1104.2. In the second measurement area 1201 the beam of the third interferometer 1203 comprises a third primary beam 1203.1 and a third secondary beam 1203.2, the beam of the fourth interferometer 1204 comprises a fourth primary beam 1204.1 and a fourth secondary beam 1204.2.

It is noted that the arrangement of primary and secondary beams can be changed dependent on the situations without affecting the invention. For example, it may be practical in light of physical constraints to arrange the first interferometer 1103 with the first primary beam 1103.1 left of the first secondary beam 1103.2, as in the shown embodiment, but arrange the second interferometer 1104 with the second primary beam 1104.1 on the right of the second secondary beam 1104.2.

The interferometers 1103, 1104, 1203, 1204 may for example be double-pass interferometers. The first interferometer 1103 may determine the distance of the target surface 1301 of the object 1300 from a combination of the distance travelled by the first primary beam 1103.1 and the first secondary beam 1103.2. The same applies for the second interferometer 1104, the third interferometer 1203 and the fourth interferometer 1204.

In an embodiment, e.g. the embodiment shown in FIG. 6a, the first primary beam 1103.1 is spaced from the first secondary beam 1103.2 in a second direction X by a first beam distance 1110. The first secondary beam 1103.2 is spaced from the second primary beam 1104.1 in the second direction X by a second beam distance 1111, which is in turn spaced from the second secondary beam 1104.2 by a third beam distance 1112.

The third primary beam 1203.1 is spaced from the third secondary beam 1203.2 in the second direction X by a fourth beam distance 1210. The third secondary beam 1203.2 is spaced from the fourth primary beam 1204.1 in the second direction X by a fifth beam distance 1211, which is in turn spaced from the fourth secondary beam 1204.2 by a third beam distance 1212.

In conventional position measurement systems the distance between the primary and secondary beam is substantially equal for all interferometers used in the position measurement system. Said distances are preferably as small as possible to able to detect deviations in the distance of the object in the first direction Y as accurate as possible. The lower limit is determined by the diameter of the beams and hardware tolerances. Furthermore, the arrangement in the first and second measurement area is substantially the same. This again results in a blindness for certain spatial wavelengths.

The invention aims to solve this problem by providing an arrangement of relative position in the second direction X of beam spots impinging on the target surface 1301 from the beams 1103.1, 1103.2, 1104.1, 1104.2 emitted by the first and second interferometer 1103, 1104 being different from an arrangement of relative positions in the second direction X of beam spots impinging on the target surface 1301 from the beams 1203.1, 1203.2, 1204.1, 1204.2 emitted by the third and fourth interferometer 1203, 1204.

Preferably, at least one of the first beam distance 1110 and the fourth beam distance 1210, or the second beam distance 1111 and the fifth beam distance 1211, or the third beam distance 1112 and the sixth beam distance 1212 are different from each other. In the shown embodiment, the third beam distance 1112 is different from the sixth beam distance 1212.

Figure 6B:
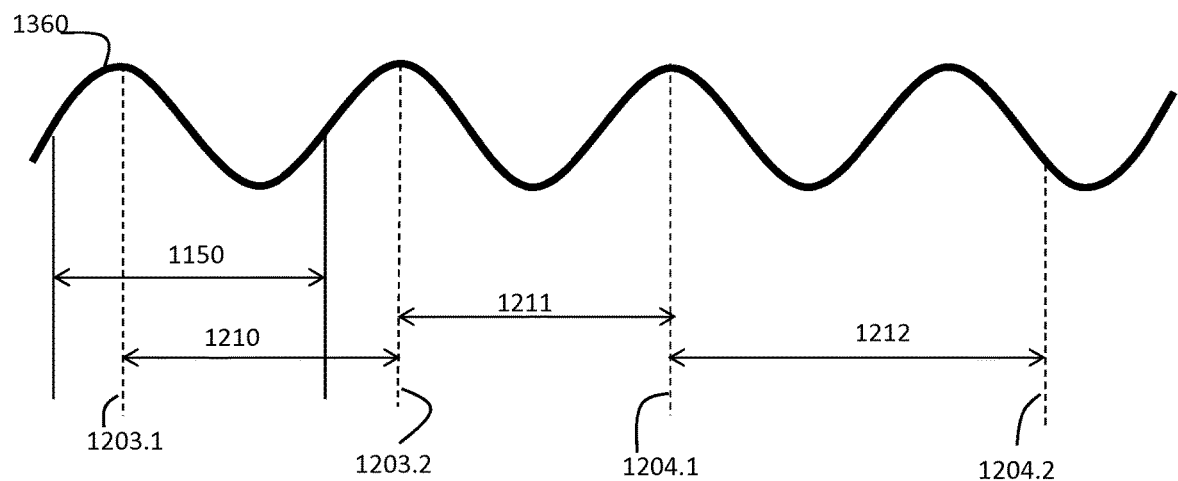

FIG. 6*b* shows a shape component 1360 of a spatial wavelength 1150 as may occur in a target surface for an interferometer based measurement system. Said wavelength 1150 is equal to the fourth distance 1210 between the third primary beam 1203.1 and the third secondary beam 1203.2, as well as the fifth distance 1211 between the third secondary beam 1203.2 and the fourth primary beam 1204.2.

Furthermore, the wavelength 1150 is also equal to the first beam distances 1110, the second beam distance 1111 and the third beam distance 1112 shown in FIG. 6*a*. The first and second interferometer 1103, 1104 are therefore blind to this spatial wavelength.

Since the sixth distance 1212 between the fourth primary beam 1204.1 and the fourth secondary beam 1204.2 is different from the third beam distance 1112, the third interferometer 1203 and fourth interferometer 1204 are not blind for this spatial wavelength, as is shown in FIG. 6*b*.

From FIG. 6*b* it can be seen that the distance to the object at the point where the fourth secondary beam 1204.2 impinges the target surface differs from other beams 1203.1, 1203.2 and 1204.1. A change in the shape of the target surface due to wavelength 1150 will therefore result in a difference between the distance of the object as determined by the third interferometer 1203 and the fourth interferometer 1204. Hence, the third interferometer 1203 and the fourth interferometer 1204 are not blind for the same spatial wavelength as the first interferometer 1103 and second interferometer 1104 are.

The position measurement system PMS shown in FIG. 6*a* may comprise a processing unit (not shown) arranged to determine the shape of the target surface. Said processing unit may comprise the same features as the processing unit of the first embodiment shown in FIG. 5*c*. Also the method for calibration as explained with reference to said first embodiment can be applied to the second embodiment of the position measurement system PMS shown in FIG. 6*a*.

The invention relates further to a lithographic apparatus LA comprising the position measurement system PMS according to the first and/or second embodiment of the invention, as is for example shown in FIG. 1. The lithographic apparatus LA according to the invention further comprises at least a mask support for holding the patterning device MA having the pattern, the projection system PS for projecting the pattern onto the substrate W, and the substrate table WT for holding the substrate W. The substrate table WT comprises the object comprising the target surface of which the position measurement system PMS is arranged to determine the shape.

Figure 7A:
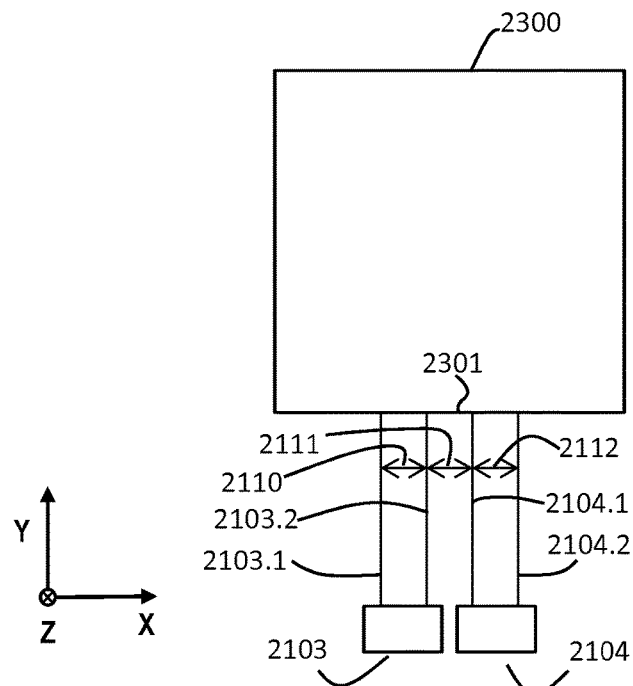

FIG. 7*a* shows an interferometer system according to the prior art comprising a first interferometer 2103 and a second interferometer 2104. The first interferometer 2103 emits a first beam 2103.1 and a second beam 2103.2 on a target surface 2301 of an object 2300 for determining the distance of the object 2300 in a first direction Y corresponding with the Y-direction in FIG. 7*a*. Similarly the second interferometer 2103 emits a third beam 2104.1 and a fourth beam 2104.2 on a target surface 2301. When seen in a second direction, corresponding with the X-direction in FIG. 7*a*, the first beam 2103.1 is spaced from the second beam 2103.2 by a distance 2110, which is in turn spaced from the third beam 2104.1 by a distance 2111. The third beam 2104.1 is spaced from the fourth beam 2104.2 by a distance 2112. The distances 2110, 2111, 2112 are substantially equal to each other. They are preferably as small as possible to able to detect deviations in the distance of the object in the first direction Y as accurate as possible. The lower limit is determined by the diameter of the beams and hardware tolerances.

Figure 7B:
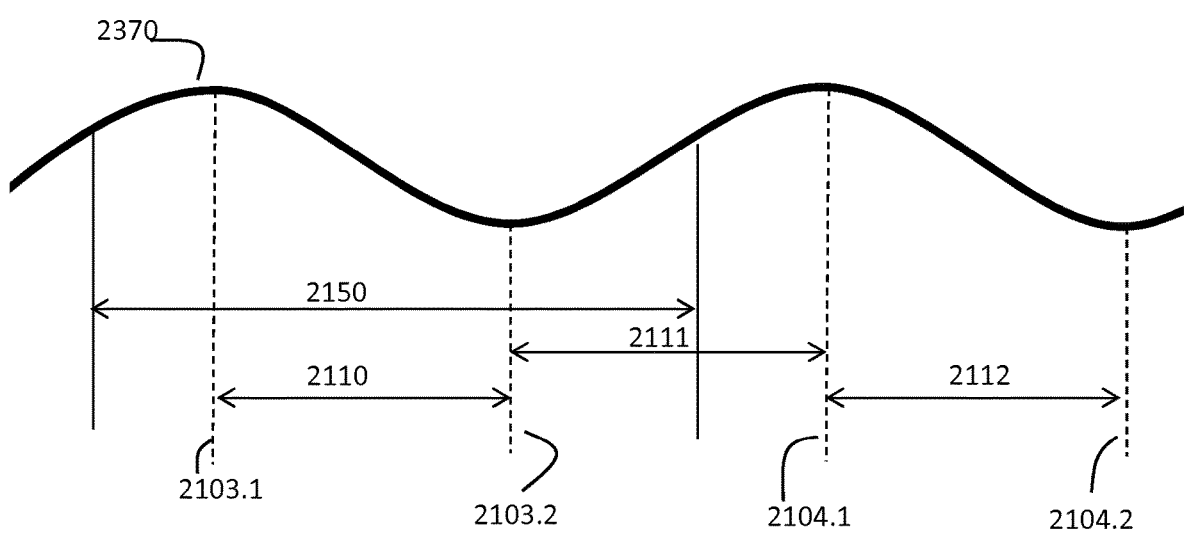

Besides the blind spot the interferometers 2103, 2104 in the known arrangement have, for a spatial wavelength that is equal to the distances 2110, 2111, 2112, an additional issue arises for spatial wavelengths which are equal to twice the distance 2110, 2111, 2112, as is illustrated in FIG. 7*b*.

The first interferometer 2103 determines a distance of the target surface 2301 of the object 2300 based on the first beam 2103.1 and the second beam 2103.2, which can be described as:

$$Y_{2103} = \frac{y_{2103.1} + y_{2103.2}}{2} \quad (1)$$

Wherein $Y_{2103}$ represents the distance of the object in the Y-direction as determined by the first interferometer 2103, and $y_{2103.1}$ and $y_{2103.2}$ represent the distance of the object 2300 at the location that the first beam 2103.1 and second beam 2103.2 respectively impinge the target surface 2301.

The second interferometer 2104 determines a distance of the target surface 2301 of the object 2300 based on the third beam 2104.1 and the fourth beam 2104.2, which can be described as:

$$Y_{2104} = \frac{y_{2104.1} + y_{2104.2}}{2} \quad (2)$$

Wherein $Y_{2104}$ represents the distance of the object in the Y-direction as determined by the second interferometer 2104, and $y_{2104.1}$ and $y_{2104.2}$ represent the distance of the object 2300 at the location that the third beam 2104.1 and fourth beam 2104.2 respectively impinge on the target surface.

In addition a rotation $R_z$ of the target surface around the Z-axis, which in FIG. 7*a* is perpendicular to the drawing, can be determined as follows:

$$R_z = \frac{Y_{2103} - Y_{2104}}{d_{2103,2104}} \quad (3)$$

Wherein $d_{2103,2104}$ represents the distance between the beams of the first interferometer 2103 and the second interferometer 2104.

Substituting equation (1) and (2) into equation (3) results in:

$$R_z = \frac{\left(\frac{y_{2103.1} + y_{2103.2}}{2}\right) - \left(\frac{y_{2104.1} + y_{2104.2}}{2}\right)}{d_{2103,2104}} \quad (4)$$

By moving the target surface 2301 in the second direction X $Y_{2103}$, $Y_{2104}$ and $R_z$ can be determined for a plurality of locations of the target surface 2301. A plurality of equations can be determined wherein $y_{2103.1}$, $Y_{2103.2}$, $Y_{2104.1}$, $Y_{2104.2}$ represent the distance of the target surface to the interferometers, and thereby represent the shape of the target surface. From the pluralities of equations (4) the shape of the target surface can be reconstructed. However, when $R_z$ equals 0 no information can be derived from equation (4).

FIG. 7b shows a shape component 2370 of a spatial wavelength 2150 which is twice as long as the distances 2110, 2111 and 2112. For this spatial wavelength $Y_{2103}$ is equal to $Y_{2104}$ resulting in $R_z$ being zero. As such the changes of the shape of the target surface caused by this spatial wavelength 2150 cannot be determined. In addition, spatial wavelengths that are close to spatial wavelengths 2150 result in very small $R_z$, which leads to larger errors in the determination of the shape of the target surface.

An object of the invention is to increase the accuracy of the calibration. This object is achieved with the interferometer system according to the second aspect of the invention shown in FIG. 8a.

Figure 8A:
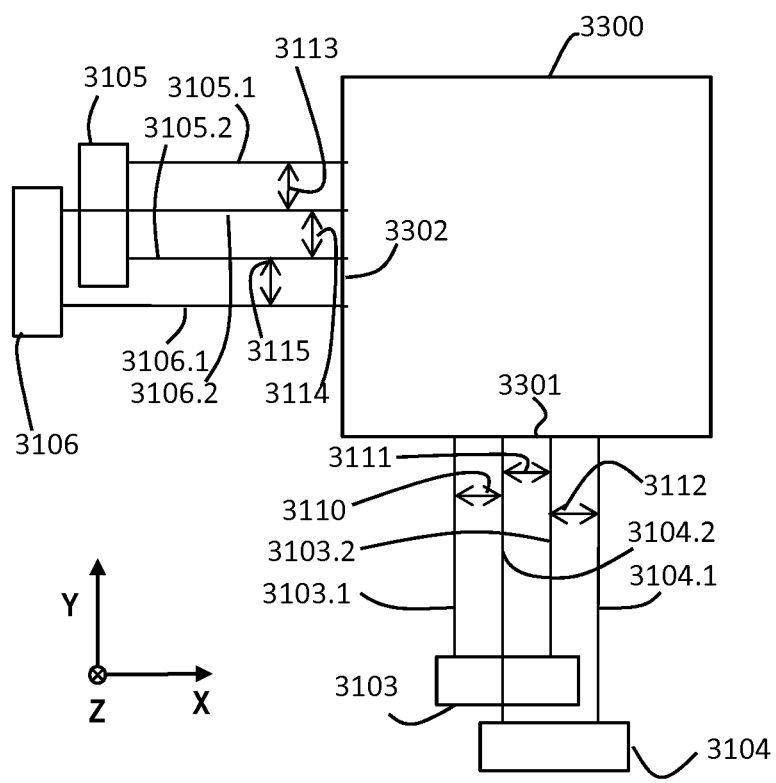

FIG. 8a shows an interferometer system for measuring the position of an object 3300 comprising a target surface 3301. The system comprises a first interferometer 3103 arranged to determine a first object distance in a first direction Y by emitting a first beam 3103.1 and a second beam 3103.2 on the target surface 3301 of the object 3300. The interferometer system further comprises a second interferometer 3104 arranged to determine a second object distance in the first direction Y by emitting a third beam 3104.1 and a fourth beam 3104.2 on the target surface 3301 of the object 3300. The first beam 3103.1, the second beam 3103.2, the third beam 3104.1, and the fourth beam 3104.2 are spaced from each other in a second direction X. According to the invention, the third beam 3104.1 is arranged between the first beam 3103.1 and the second beam 3103.2 in the second direction X.

In an embodiment, e.g. the embodiment shown in FIG. 8a, the second beam 3103.2 is arranged between the third beam 3104.1 and the fourth beam 3104.2 in the second direction X.

In an embodiment, e.g. the embodiment shown in FIG. 8a, the first beam 3103.1 is spaced from the third beam 3104.1 in the second direction X by a first beam distance 3110, the third beam 3104.1 is spaced from the second beam 3103.1 in the second direction X by a second beam distance 3111, and the second beam 3103.2 is spaced from the fourth beam 3104.2 in the second direction X by a third beam distance 3112. The first beam distance 3110, the second beam distance 3111 and the third beam distance 3112 are substantially equal. For example, the first beam distance 3110, the second beam distance 3111 and the third beam distance 3112 may be 13 mm.

For the interferometer system according to the second aspect of the invention the equations (1)-(4) can be reformulated as:

$$Y_{3103} = \frac{y_{3103.1} + y_{3103.2}}{2} \quad (5)$$

$$Y_{3104} = \frac{y_{3104.1} + y_{3104.2}}{2} \quad (6)$$

$$R_z = \frac{Y_{3103} - Y_{3104}}{d_{3103,3104}} \quad (7)$$

$$R_z = \frac{\left(\frac{y_{3103.1} + y_{3103.2}}{2}\right) - \left(\frac{y_{3104.1} + y_{3104.2}}{2}\right)}{d_{3103,3104}} \quad (8)$$

Wherein $Y_{3103}$ represents the first object distance and $Y_{3104}$ represents the second object distance.

Figure 8B:
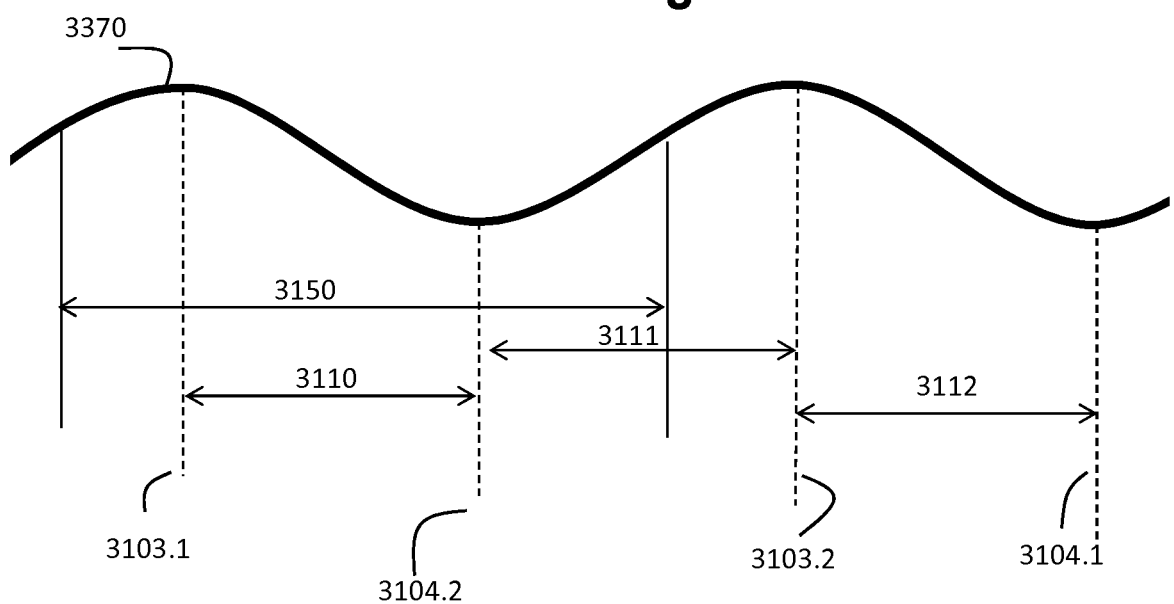

FIG. 8b shows a shape component 3370 of a spatial wavelength 3150 which is twice as long as the first beam distance 3110, the second beam distance 3111 and the third beam distance 3112. The distance between the first beam 3103.1 and the second beam 3103.2 of the first interferometer 3103 is equal to the spatial wavelength 3150, as is the distance between the third beam 3104.1 and the fourth beam 3104.2 of the second interferometer 3104. A change in the shape of the target surface caused by spatial wavelength 3150 results in $Y_{3103}$ and $Y_{3104}$ being different from each other, meaning that $R_z$ is not equal to zero.

The second aspect of the invention provides in an interferometer system which enables more accurate reconstruction of the shape of the target surface, in particular for spatial wavelengths which are equal to twice the distance between the beams emitted by interferometers of the interferometer system. Advantageously the distances 3110, 3111, 3112 between consecutive beams in the second direction X can still be as small as possible, e.g. half of spatial wavelength 3150.

Figure 8C:
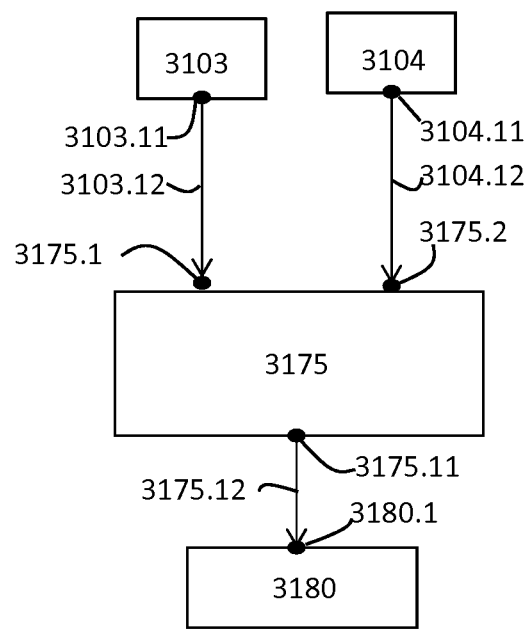

In an embodiment the interferometer system further comprises a processing unit 3175, e.g. as shown in FIG. 8c, arranged to determine the shape of the target surface 3301 based on the first and second object distances determined by the first interferometer 3103 and second interferometer 3104.

In the shown embodiment each of the interferometers 3103, 3104 comprises an output terminal 3103.11, 3104.11 respectively, to send a signal 3103.12, 3104.12 respectively to the processing unit 3175. Said signals 3103.12, 3104.12 represent the distance of the object as determined by the respective interferometer 3103, 3104. In the shown embodiment the processing unit 3175 comprises two input terminals 3175.1, 3175.2 for receiving said signals 3103.12, 3104.12, although it is noted that in some embodiments this could be incorporated in a single input terminal. The processing unit 3175 determines the shape of the target surface based on the received signals and may e.g. be connected to a positioning system 3180 for sending a signal 3175.12 representing a determined position of the object via an output terminal 3175.11 to an input terminal 3180.1 of the positioning system 3180. For determining said position of the object the determined shape of the target surface may be taken into account. The positioning system 3180 is arranged to position the object.

The processing unit 3175 may for example apply equation (8) for a plurality of locations of the target surface in the second direction X, resulting in a plurality of equations which can be reformulated in a matrix-equation. Said matrix equation can e.g. be solved using least squares method or spline interpolation. In an embodiment the processing unit 3175 is arranged to take into account design data when determining the shape of the target surface. Such design data may e.g. include statistical expectations of spatial wavelengths, which may e.g. be caused by hardware specifications or tolerances. It may also include that spatial wavelengths under a predetermined limit do no occur in the shape of the target surface, or that information regarding such spatial wavelengths are retrieved from another measurement. It may also include that the shape of the target surface does not include protrusions or grooves larger than a predetermined limit. It may also include independent measurements which have been performed earlier or the same or similar objects. By taking into account this information the accuracy of the determination of the shape of the target surface can be increased.

To arrange the third beam 3104.1 between the first beam 3103.1 and the second beam 3103.2 as shown in FIG. 8a, the first interferometer 3103 and/or the second interferometer 3104 may comprises components such as mirrors and/or a periscope in the light path to direct the beams correctly.

The interferometer system according to the second aspect of the invention may be incorporated in a position measurement system PMS for determining the position of the object 3300.

Said position measurement system PMS may be incorporated in a lithographic apparatus as is for example shown in FIG. 1. The lithographic apparatus LA according to the invention further comprises at least a mask support for holding the patterning device MA having the pattern, the projection system PS for projecting the pattern onto the substrate W, and the substrate table WT for holding the substrate W.

In an embodiment of the lithographic apparatus LA the substrate table WT comprises the object comprising the target surface of which the position measurement system PMS is arranged to determine the shape.

In an embodiment of the lithographic apparatus LA the mask support MT comprises the object comprising the target surface of which the position measurement system PMS is arranged to determine the shape.

Each of the systems shown FIG. 5a, FIG. 6a and FIG. 8a comprises an optional further position measurement system.

In FIG. 5a the further position measurement system is arranged to determine a position of the object 30. The further position measurement system comprises a further first interferometer 105 and a further second interferometer 106 arranged to determine a distance of the object 300 in a further first direction X when the object is in the first measurement area by emitting beams 105.1, 106.1 onto a further target surface 302 of the object 300. It further comprises a further third interferometer 205 and a further fourth interferometer 206 arranged to determine a distance of the object 300 in the further first direction X when the object 300 is in the second measurement area 201 by emitting beams onto the further target surface 302 of the object 300. An arrangement of relative positions in a further second direction Y of beams spots impinging on the further target surface 302 from the beams 105.1, 106.1 emitted by the further first 105 and further second interferometer 106 is different from an arrangement of relative positions in the further second direction Y of beams spots impinging on the further target surface 302 from the beams 205.1, 206.1 emitted by the further third and further fourth interferometer 205, 206.

In FIG. 6a the further position measurement system comprises a further first interferometer 1105 and a further second interferometer 1106 arranged in the first measurement area 1101 for determining the distance of the object 1300 in a further first direction X by emitting beams onto a further target surface 1302 of the object 1300. The further position measurement system further comprises a further third interferometer 1205 and a further fourth interferometer 1206 arranged in the second measurement area 1201. The beam of the further first interferometer 1105 comprises a further first primary beam 1105.1 and a further first secondary beam 1105.2, the beam of the further second interferometer 1106 comprises a further second primary beam 1106.1 and a further second secondary beam 1106.2. In the second measurement area 1201 the beam of the further third interferometer 1205 comprises a further third primary beam 1205.1 and a further third secondary beam 1205.2, and the beam of the further fourth interferometer 1206 comprises a further fourth primary beam 1206.1 and a further fourth secondary beam 1206.2. An arrangement of relative positions in a further second direction Y of beams spots impinging on the further target surface 1302 from the beams 1105.1, 1105.2, 1106.1, 1106.2 emitted by the further first 1105 and further second interferometer 1106 is different from an arrangement of relative positions in the further second direction Y of beams spots impinging on the further target surface 1302 from the beams 1205.1, 1205.2 1206.1, 1206.2 emitted by the further third 1205 and further fourth interferometer 1206.

In FIG. 8a the further position measurement system comprises a further interferometer system for measuring the position of the object 3300, in particular the position of a further target surface 3302. The further interferometer system comprises a further first interferometer 3105 arranged to determine a further first object distance in a further first direction X by emitting a further first beam 3105.1 and a further second beam 3105.2 on the further target surface 3302 of the object 3300, and a further second interferometer 3106 arranged to determine a further second object distance in the further first direction X by emitting a further third beam 3106.1 and a further fourth beam 3106.2 on the further target surface 3302 of the object 3300. The further first beam 3105.1, the further second beam 3105.2, the further third beam 3106.1, and the further fourth beam 3106.2 are spaced from each other in a further second direction, corresponding with the Y-direction in FIG. 8a. The further third beam 3106.1 is arranged between the further first beam 3105.1 and the further second beam 3105.2 in the further second direction Y. The further second beam 3105.2 is arranged between the further third beam 3106.1 and the further fourth beam 3106.2 in the further second direction Y.

In the shown embodiments in FIGS. 5a, 6a and 8a the further position measurement system is embodied the same as the position measurement system shown in the respective figures; however, this is not required. The further position measurement system may be according to another embodiment or aspect of the invention, or may be a position measurement system not according to the invention.

In the shown embodiments in FIGS. 5a, 6a and 8a the further first direction X of the further position measurement system corresponds with the second direction X of the position measurement system and the further second direction Y of the further position measurement system corresponds with the first direction Y of the position measurement system.

The further position measurement system may comprise a processing unit arranged to determine the shape of a further target surface of the object in the first direction Y. In an embodiment the processing unit of the further position measurement system and the processing of the position measurement system are incorporated in or embodied as a single processing unit.

Equations similar to equations (5)-(8) can be formulated for the further measurement system, to determine with the further position measurement system the distance of the object in the X-direction and the rotation $R_z$ around the Z-axis, which is perpendicular to the paper in FIGS. 5a, 6a and 8a. The position measurement determines the distance of the object in the Y-direction and the rotation $R_z$ around the Z-axis, e.g. with equations (5)-(8) or equations similar to those. The combination of the position measurement and the further position measurement system provides 4 interferometers for determining three degrees of freedom of the object, being the distance in the X-direction, the distance in the Y-direction and the rotation $R_z$ around the Z-axis. Redundant information regarding the rotation $R_z$ around the Z-axis is available from this combination. Said redundant information may be used to determine the shape of the target surface 301, 1301, 3301 and/or the further target surface 302, 1302, 3302 of the object 300, 1300, 3300.

An apparatus, e.g. a lithographic apparatus, comprising such combination of a position measurement system and a further position measurement system may comprise a positioning system arranged to position the object 300, 1300, 3300. The positioning system may comprises a control algorithm arranged to position of the object 300, 1300, 3300 based on the distance in the X-direction, the distance in the Y-direction and the rotation $R_z$ around the Z-axis determined by the position measurement system and the further position measurement system. The redundant information regarding the rotation $R_z$ around the Z-axis may then be used to determine the shape of the target surface 301, 1301, 3301 or the further target surface 302, 1302, 3302 of the object 300, 1300, 3300. As such said shape can be determined even when the positioning system adjusts the position of the object 300, 1300, 3300. For example, the position system may be arranged to automatically adjust the position of the object 300, 1300, 3300 based on the measurements of the position measurement system. A spatial wavelength which results in both interferometers, e.g. in a single measurement area, determining the same distance of the object may then cause the positioning system to determine that the object is incorrectly positioned and to automatically adjust the position of the object. This results in the position measurement system not being able to detect that said measurement was actually caused by a spatial wavelength in the shape of the target surface. Both aspects of the invention are especially advantageous in such systems.

The first and second aspect of the invention have herein been described to in general determine the shape of the target surface 301, 1301, 3301 in the second direction X. In an embodiment the object 300, 1300, 3300 can be arranged to be positioned in a third direction Z perpendicular to the paper in FIGS. 5a, 6a and 8a. As such the shape of the target surface 301, 1301, 3301 in the second direction X can be determined for a plurality of locations of the target surface in the third direction. In an embodiment the processing unit may be arranged to combine object distances determined with the interferometers in different locations in the third direction to determine the shape of the target surface 301, 1301, 3301 in the third direction. In an embodiment the object 300, 1300, 3300 can be arranged to be at least partially tilted around the Y-axis. The position measurement system can then determine the shape of the target surface 301, 1301, 3301 in said tilted direction, e.g. by determining equations similar to (1)-(8). In an embodiment equations determined in the tilted arrangement can be combined with equations determined in the non-tilted arrangement for corresponding locations of the target surface 301, 1301, 3301 to increase the accuracy.

It is noted that the first aspect and the second aspect of the invention can advantageously be combined. For example the interferometers in the first and/or second measurement area of the position measurement area according to the first aspect of the invention can be embodied in accordance with the second aspect of the invention.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments are provided according to the following clauses:

1. A position measurement system for determining a position of an object, the position measurement system comprising
a first interferometer and a second interferometer arranged to determine a distance of the object in a first direction when the object is in a first measurement area by emitting beams onto a target surface of the object,
a third interferometer and a fourth interferometer arranged to determine a distance of the object in the first direction when the object is in a second measurement area by emitting beams onto the target surface of the object,
wherein an arrangement of relative positions in a second direction of beams spots impinging on the target surface from the beams emitted by the first and second interferometer is different from an arrangement of relative positions in the second direction of beams spots impinging on the target surface from the beams emitted by the third and fourth interferometer.

2. The position measurement system according to clause 1, wherein a distance between a beam emitted by the first interferometer and a beam emitted by the second interferometer in the second direction is different from a distance between a beam emitted by the third interferometer and a beam emitted by the fourth interferometer in the second direction.

3. The position measurement system according clause 2, wherein the beam of the first interferometer comprises a first primary beam and a first secondary beam, the beam of the second interferometer comprises a second primary beam and a second secondary beam, the beam of the third interferometer comprises a third primary beam and a third secondary beam, and the beam of the fourth interferometer comprises a fourth primary beam and a fourth secondary beam.

4. The position measurement system according to clause 3, wherein
the first primary beam is spaced from the first secondary beam in the second direction by a first beam distance,
the first secondary beam is spaced from the second primary beam in the second direction by a second beam distance,
the second primary beam is spaced from the second secondary beam in the second direction by a third beam distance,
the third primary beam is spaced from the third secondary beam in the second direction by a fourth beam distance,
the third secondary beam is spaced from the fourth primary beam in the second direction by a fifth beam distance, and the fourth primary beam is spaced from the fourth secondary beam in the second direction by a sixth beam distance, wherein at least one of the first and fourth beam distance, or the second and fifth beam distance, or the third and sixth beam distance are different from each other.

5. The position measurement system according to any of clauses 1-4, further comprising a processing unit arranged to determine the shape of the target surface based on the distances of the object as determined by the first interferometer, the second interferometer, the third interferometer and the fourth interferometer.

6. The position measurement system according to clause 5, wherein the processing unit is configured to determine a reference position of the target surface of the object in the second direction relative to the beams of the first and second interferometer when the object is in the first measurement area and relative to the beams of the third and fourth interferometer when the object is in the second measurement area, and the processing unit is arranged to determine the shape of the target surface based on the determined reference positions.

7. The position measurement system according to clause 5 or clause 6, the processing unit further being arranged to:

determine a first spatial wavelengths profile of the shape of the target surface based on the distances of the object determined by the first and second interferometer in the first measurement area, determine a second spatial wavelengths profile of the shape of the target surface based on the object distances determined in the second measurement area, and make a weighted combination of the first spatial wavelength profile and the second spatial wavelength profile, wherein weight coefficients are based on differences between the first spatial wavelength profile and second spatial wavelengths profile.

8. The position measurement system according to any of clauses 5-7, wherein the processing unit is arranged to take into account design data when determining the shape of the target surface.

9. A lithographic apparatus comprising the position measurement system according to any of clauses 1-8, a mask support for holding a patterning device having a pattern, a projection system for projecting the pattern onto a substrate, and a substrate table for holding the substrate, wherein the substrate table comprises the object.

10. A method for calibrating a position measurement system for positioning an object, the method comprising:

arranging the object in a first measurement area, moving the object in a second direction in the first measurement area and determining a plurality of distances of the object in a first direction using a first interferometer and a plurality of distances of the object in the first direction using a second interferometer, arranging the object in a second measurement area, moving the object in the second direction in the second measurement area and determining a plurality of distances of the object in the first direction using a third interferometer and a plurality of distances of the object in the first direction using a fourth interferometer, wherein an arrangement of beams emitted by the first and second interferometer onto a target surface of the object is different from an arrangement of beams emitted by the third and fourth interferometer onto the target surface of the object, determining the shape of the target surface of the object based on the pluralities of distances of the object as determined by the interferometers in the first and second measurement area.

Although specific reference may be made in this text to embodiments of the invention in the context of a lithographic apparatus, embodiments of the invention may be used in other apparatus.

Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A position measurement system for determining a position of an object, the position measurement system comprising:

a first interferometer and a second interferometer arranged to determine a distance of the object in a first direction when the object is in a first measurement area by emitting beams onto a target surface of the object, a third interferometer and a fourth interferometer arranged to determine a distance of the object in the first direction when the object is in a second measurement area by emitting beams onto the target surface of the object, and a processing unit configured to determine a shape of the target surface based on the distances of the object as determined by the first interferometer, the second interferometer, the third interferometer and the fourth interferometer, wherein an arrangement of relative positions in a second direction of beam spots impinging on the target surface from the beams emitted by the first and second interferometers is different from an arrangement of relative positions in the second direction of beams spot impinging on the target surface from the beams emitted by the third and fourth interferometers.

2. The position measurement system according to claim 1, wherein a distance between a beam emitted by the first interferometer and a beam emitted by the second interferometer in the second direction is different from a distance between a beam emitted by the third interferometer and a beam emitted by the fourth interferometer in the second direction.

3. The position measurement system according to claim 2, wherein the beam of the first interferometer comprises a first primary beam and a first secondary beam, the beam of the second interferometer comprises a second primary beam and a second secondary beam, the beam of the third interferometer comprises a third primary beam and a third secondary beam, and the beam of the fourth interferometer comprises a fourth primary beam and a fourth secondary beam.

4. The position measurement system according to claim 3, wherein:
the first primary beam is spaced from the first secondary beam in the second direction by a first beam distance,
the first secondary beam is spaced from the second primary beam in the second direction by a second beam distance,
the second primary beam is spaced from the second secondary beam in the second direction by a third beam distance,
the third primary beam is spaced from the third secondary beam in the second direction by a fourth beam distance,
the third secondary beam is spaced from the fourth primary beam in the second direction by a fifth beam distance, and
the fourth primary beam is spaced from the fourth secondary beam in the second direction by a sixth beam distance,
wherein at least one selected from: the first and fourth beam distance, or the second and fifth beam distance, or the third and sixth beam distance, are different from each other.

5. The position measurement system according to claim 1, wherein the processing unit is configured to determine a reference position of the target surface of the object in the second direction relative to the beams of the first and second interferometers when the object is in the first measurement area and relative to the beams of the third and fourth interferometers when the object is in the second measurement area, and the processing unit is arranged to determine the shape of the target surface based on the determined reference positions.

6. The position measurement system according to claim 5, wherein the reference position is determined by recognizing a marker which is arranged on the target surface.

7. The position measurement system according to claim 1, wherein the processing unit is further configured to at least:
determine a first spatial wavelength profile of the shape of the target surface based on the distances of the object in the first measurement area determined by the first and second interferometers,
determine a second spatial wavelength profile of the shape of the target surface based on the distances of the object in the second measurement area determined by the third and fourth interferometers, and
make a weighted combination of the first spatial wavelength profile and the second spatial wavelength profile, wherein weight coefficients are based on differences between the first spatial wavelength profile and second spatial wavelength profile.

8. The position measurement system according to claim 1, wherein the processing unit is arranged to take into account design data when determining the shape of the target surface.

9. A lithographic apparatus comprising
the position measurement system according to claim 1,
a projection system configured to project a pattern onto a substrate, and
a substrate table configured to hold the substrate,
wherein the substrate table comprises the object.

10. The position measurement system according to claim 1, wherein a beam of the third interferometer is arranged between a beam of the first interferometer and a beam of the second interferometer in the second direction.

11. The position measurement system according to claim 1, wherein a beam of the second interferometer is arranged between a beam of the third interferometer and a beam of the fourth interferometer in the second direction.

12. A method for calibrating a position measurement system for positioning an object, the method comprising:
moving an object in a second direction in a first measurement area and determining a plurality of distances of the object in a first direction using a first interferometer and a plurality of distances of the object in the first direction using a second interferometer,
moving the object in the second direction in a second measurement area and determining a plurality of distances of the object in the first direction using a third interferometer and a plurality of distances of the object in the first direction using a fourth interferometer, wherein an arrangement of beams emitted by the first and second interferometers onto a target surface of the object is different from an arrangement of beams emitted by the third and fourth interferometers onto the target surface of the object, and
determining a shape of the target surface of the object based on the pluralities of distances of the object in the first and second measurement areas as determined by the first, second, third and fourth interferometers.

13. The method according to claim 12, wherein a distance in the second direction between a beam emitted by the first interferometer and a beam emitted by the second interferometer is different from a distance in the second direction between a beam emitted by the third interferometer and a beam emitted by the fourth interferometer.

14. The method according to claim 12, further comprising determining a reference position of the target surface of the object in the second direction relative to the beams of the first and second interferometers when the object is in the first measurement area and relative to the beams of the third and fourth interferometers when the object is in the second measurement area, and determining the shape of the target surface based on the determined reference positions.

15. The method according to claim 12, further comprising:
determining a first spatial wavelength profile of the shape of the target surface based on the distances of the object in the first measurement area determined by the first and second interferometers, determining a second spatial wavelength profile of the shape of the target surface based on the distances of the object in the second measurement area determined by the third and fourth interferometers, and making a weighted combination of the first spatial wavelength profile and the second spatial wavelength profile, wherein weight coefficients are based on differences between the first spatial wavelength profile and second spatial wavelength profile.

16. A computer program product comprising a non-transitory computer-readable medium having instructions therein, the instructions, upon execution by a computer system, configured to cause the computer system to at least:

obtain a plurality of distances of an object in a first direction using a first interferometer and a plurality of distances of the object in the first direction using a second interferometer, for movements of the object in a second direction in a first measurement area, obtain a plurality of distances of the object in the first direction using a third interferometer and a plurality of distances of the object in the first direction using a fourth interferometer, for movements of the object in the second direction in a second measurement area, wherein an arrangement of beams emitted by the first and second interferometers onto a target surface of the object is different from an arrangement of beams emitted by the third and fourth interferometers onto the target surface of the object, and determine a shape of the target surface of the object based on the pluralities of distances of the object in the first and second measurement areas as determined by the first, second, third and fourth interferometers.

17. The computer program product of claim 16, wherein a distance in the second direction between a beam emitted by the first interferometer and a beam emitted by the second interferometer is different from a distance in the second direction between a beam emitted by the third interferometer and a beam emitted by the fourth interferometer.

18. The computer program product of claim 16, wherein the instructions are further configured to determine a reference position of the target surface of the object in the second direction relative to the beams of the first and second interferometers when the object is in the first measurement area and relative to the beams of the third and fourth interferometers when the object is in the second measurement area, and the instructions configured to cause the computer system to determine the shape of the target surface are further configured to determine the shape of the target surface based on the determined reference positions.

19. The computer program product of claim 16, wherein the instructions are further configured to cause the computer system to:

determine a first spatial wavelength profile of the shape of the target surface based on the distances of the object in the first measurement area determined by the first and second interferometers, determine a second spatial wavelength profile of the shape of the target surface based on the distances of the object in the second measurement area determined by the third and fourth interferometers, and make a weighted combination of the first spatial wavelength profile and the second spatial wavelength profile, wherein weight coefficients are based on differences between the first spatial wavelength profile and second spatial wavelength profile.

20. The computer program product of claim 16, wherein the instructions are further configured to take into account design data when determining the shape of the target surface.

* * * * *